(12) United States Patent
Chen et al.

(10) Patent No.: US 11,397,641 B2
(45) Date of Patent: *Jul. 26, 2022

(54) SYSTEMS AND METHODS FOR ULTRA FAST ECC WITH PARITY

(71) Applicant: Innogrit Technologies Co., Ltd., Shanghai (CN)

(72) Inventors: Jie Chen, Milpitas, CA (US); Zining Wu, Los Altos, CA (US)

(73) Assignee: Innogrit Technologies Co., Ltd., Shanghai (CN)

( * ) Notice: Subject to any disclaimer, the term of this patent is extended or adjusted under 35 U.S.C. 154(b) by 5 days.

This patent is subject to a terminal disclaimer.

(21) Appl. No.: 17/031,100

(22) Filed: Sep. 24, 2020

(65) Prior Publication Data

US 2021/0004290 A1    Jan. 7, 2021

Related U.S. Application Data

(63) Continuation of application No. 16/006,894, filed on Jun. 13, 2018, now Pat. No. 10,817,372.

(51) Int. Cl.
*G06F 11/10* (2006.01)
*G11C 29/52* (2006.01)

(52) U.S. Cl.
CPC .......... *G06F 11/1068* (2013.01); *G11C 29/52* (2013.01)

(58) Field of Classification Search
CPC ............ G06F 11/1068; G06F 11/1048; G06F 11/1012; G11C 29/52; G11C 2029/0411

USPC ......................................................... 714/764
See application file for complete search history.

(56) References Cited

U.S. PATENT DOCUMENTS

| | | | | |
|---|---|---|---|---|
| 9,092,362 | B1* | 7/2015 | Alcantara | G06F 11/10 |
| 9,430,326 | B2* | 8/2016 | Barndt | G06F 11/1068 |
| 2013/0179753 | A1* | 7/2013 | Flynn | G06F 11/1044 |
| | | | | 714/773 |
| 2013/0205183 | A1* | 8/2013 | Fillingim | H03M 13/353 |
| | | | | 714/773 |
| 2016/0110249 | A1* | 4/2016 | Orme | G06F 11/1016 |
| | | | | 714/6.24 |
| 2017/0102993 | A1* | 4/2017 | Hu | G11C 29/52 |
| 2018/0053545 | A1* | 2/2018 | Son | G11C 11/419 |
| 2018/0167088 | A1* | 6/2018 | Vakilinia | H03M 13/2945 |
| 2018/0373591 | A1* | 12/2018 | Barndt | G06F 11/1068 |

* cited by examiner

*Primary Examiner* — James C Kerveros
(74) *Attorney, Agent, or Firm* — IPro, PLLC; Xiaomin Huang

(57) ABSTRACT

Systems, apparatus and methods are provided for providing fast non-volatile storage access with ultra-low latency. A method may comprise dividing a user data unit into a plurality of data chunks, generating a plurality of error correction code (ECC) codewords and at least one ECC parity block and transmitting the plurality of ECC codewords and the at least one ECC parity block to a plurality of channels of the non-volatile storage device for each of the plurality of ECC codewords and the at least one ECC parity block to be stored in different channels of the plurality of channels.

20 Claims, 11 Drawing Sheets

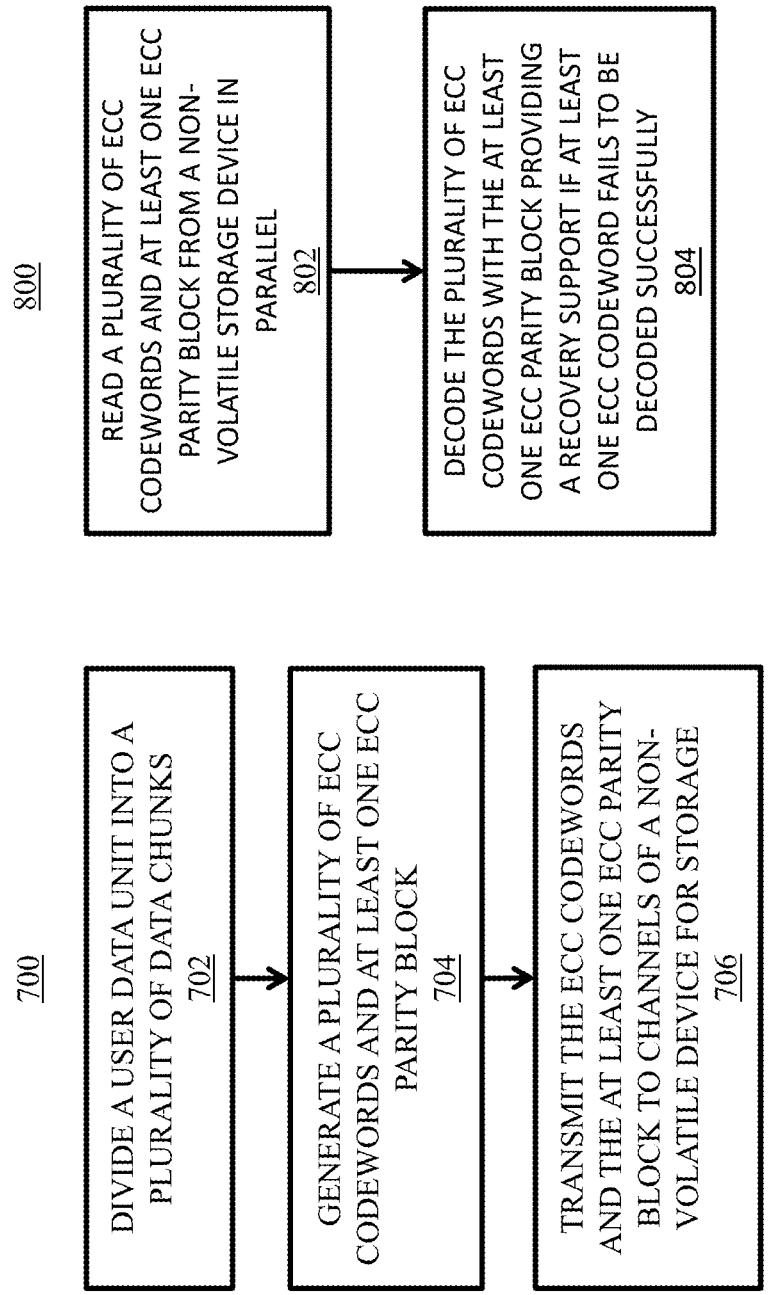

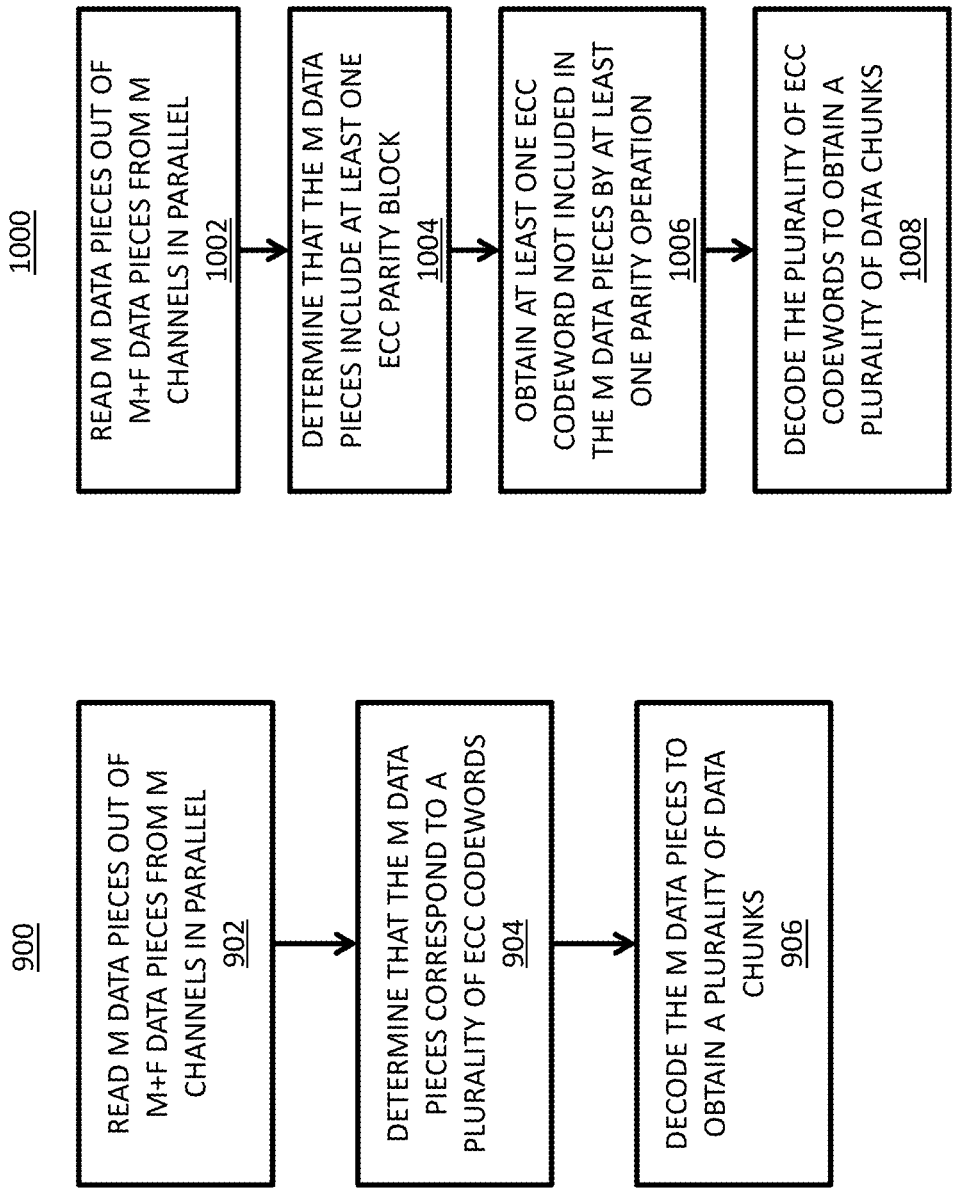

SYSTEMS AND METHODS FOR ULTRA FAST ECC WITH PARITY

TECHNICAL FIELD

The disclosure herein relates to non-volatile storage, particularly relates to ultra-fast ECC with parity protection.

BACKGROUND

Computing systems have traditionally used a wide variety of non-volatile storage devices to maintain and store data and instructions, for example, floppy disks, hard drives, magnetic tapes, optical discs. More recently, non-volatile NAND storage devices have gained wide usage in memory cards, USB flash drives and solid-state drives (SSDs). Although compared to the more traditional non-volatile storage devices, NAND devices can provide high throughput by conventional channel-level parallelism, die-level parallelism, or plane-level parallelism, access latency still exists and can be improved. Moreover, although error correction code (ECC) has been used in non-volatile storage to provide redundancy and error correction, there is still a need in the art for better protection against data corruption and efficient data recovery.

SUMMARY

The disclosed subject matter relates to systems, methods, and devices that provide robust data storage in a non-volatile storage device with improved data protection against corruption and ultra-fast access. According to various aspects of the subject innovation, an ECC scheme combined with Redundant Array of Independent Disk (RAID) technology is provided to achieve enhanced ECC robustness with very short latency in a multi-channel non-volatile storage system, such as but not limited to, a SSD system. The data transfer latency may be reduced by a factor of M (e.g., number of channels) by utilizing channel parallelism to distribute a data stream/unit into multiple channels. The ECC latency may be reduced by using a high performance ECC engine to process M data chunks in parallel. Moreover, parity information may be generated and stored to provide robust protection against data loss.

In various embodiments, the original data stream may be spread into different channels and each partition may be protected by an ECC codeword separately. Therefore, the error probability that the original data stream cannot be retrieved because a portion of the stored data fails may be greatly reduced. Furthermore, RAID technology may be applied to protect M-channel ECC data with one or more extra channels that may store parity information to further enhance the ECC reliability and robustness. For example, RAID-5 may use one extra channel to provide recovery support if one channel fails and RAID-6 may use two extra channels to provide recovery support if two channels fail. The long latency required by RAID recovery may be completely saved or minimized to one or more extra ECC decoding latency of 1/M data chunk. The extra channels may be utilized for RAID parity programming and other long latency operation (such as ERASE) while the other M channels are active/busy, which may further improve the Quality of Service (QoS) performance.

In an exemplary embodiment, there is provided a method for storing data in a non-volatile storage device. The method may comprise: dividing a user data unit into a plurality of data chunks, generating a plurality of error correction code (ECC) codewords and at least one ECC parity block and transmitting the plurality of ECC codewords and the at least one ECC parity block to a plurality of channels of the non-volatile storage device for each of the plurality of ECC codewords and the at least one ECC encoded parity block to be stored in different channels of the plurality of channels.

In another exemplary embodiment, there is provided an apparatus that may comprise a first interface to be coupled to a host, a parity generation circuit block configured to generate at least one parity block for a plurality of data chunks of a user data unit received from the host, an error correction code (ECC) engine configured to encode the plurality of data chunks into a plurality of codewords and the at least one parity block into an at least one ECC parity block, and a second interface coupled to a non-volatile storage device to spread the codewords and the at least one ECC parity block across a plurality channels of the non-volatile storage device.

In yet another exemplary embodiment, there is provided an apparatus that may comprise a first interface to be coupled to a host, an error correction code (ECC) engine configured to encode the plurality of data chunks into a plurality of codewords, a parity generation circuit block configured to generate at least one ECC parity block from the plurality of codewords, and a second interface coupled to a non-volatile storage device to spread the plurality of codewords and the at least one ECC parity block across a plurality channels of the non-volatile storage device.

BRIEF DESCRIPTION OF FIGURES

FIG. 7 is a flowchart of a process for programming a multi-channel non-volatile storage device in accordance with an embodiment of the present disclosure.

FIG. 8 is a flowchart of a process for reading data from a multi-channel non-volatile storage device in accordance with an embodiment of the present disclosure.

FIG. 9 is a flowchart of a process for reading data from a multi-channel non-volatile storage device in accordance with another embodiment of the present disclosure.

FIG. 10 is a flowchart of a process for reading data from a multi-channel non-volatile storage device in accordance with another embodiment of the present disclosure.

DETAILED DESCRIPTION

Figure 1:
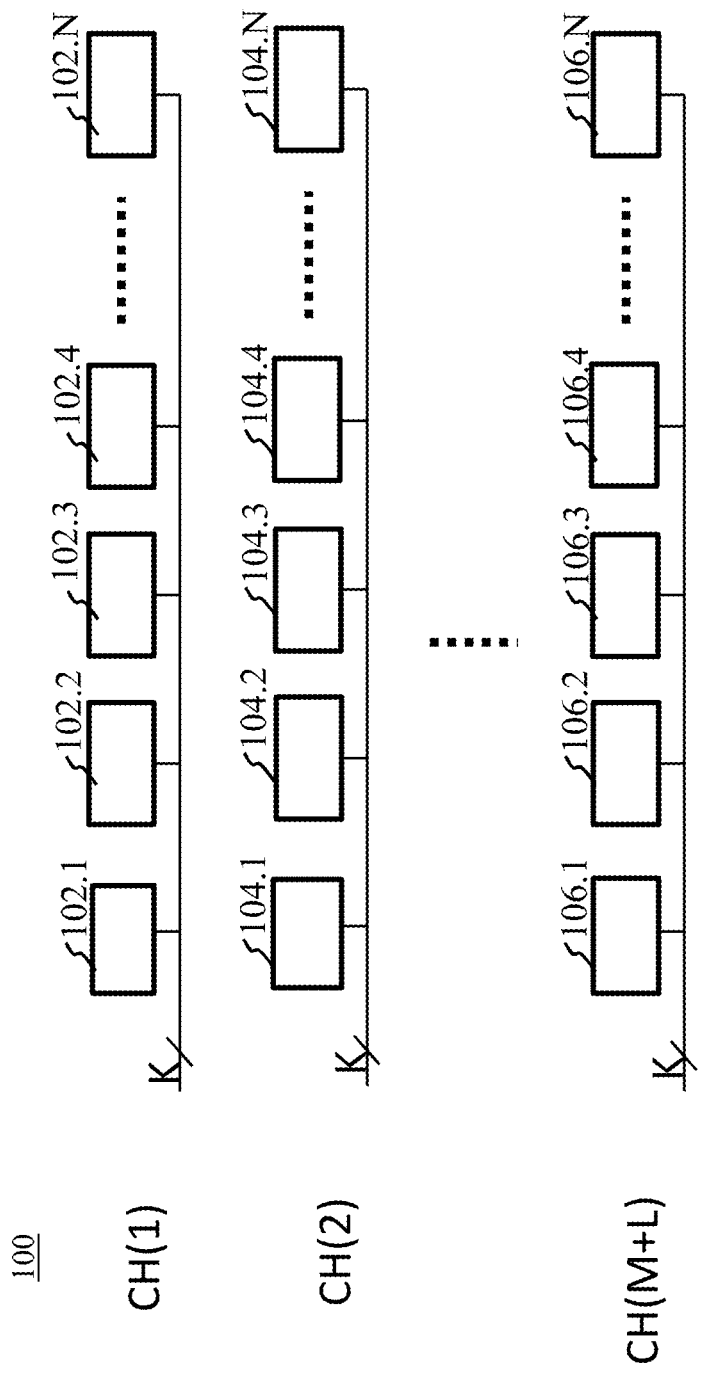
FIG. 1 schematically shows a multi-channel non-volatile storage device in accordance with an embodiment of the present disclosure.

Specific embodiments according to the present disclosure will now be described in detail with reference to the accompanying figures. Like elements in the various figures are denoted by like reference numerals for consistency.

The present disclosure provides systems and methods for fast access to non-volatile storage devices with ultra-low latency and parity protection. As used herein, a non-volatile memory device may be a computer storage device that can maintain stored information after being powered off, and the stored information may be retrieved after being power cycled (turned off and back on). Non-volatile storage devices may include floppy disks, hard drives, magnetic tapes, optical discs, NAND flash memories, NOR flash memories, magnetoresistive random Access Memory (MRAM), resistive random access memory (RRAM), phase change random access memory (PCRAM), Nano-RAM, etc. In the description, a NAND flash may be used as an example for the proposed fast access and data corruption protection techniques. Various embodiments according to the present disclosure, however, may implement the disclosed techniques with other types of non-volatile storage devices.

An embodiment according to the present disclosure may provide ultra-low access time and improve the response time for a non-volatile storage device by a factor depending on a number of channels of the non-volatile storage device. For example, for a (M+F)-channel non-volatile memory device, the response time may be improved by a factor of M. Moreover, F extra channels may be used to provide a RAID protection (e.g., parity protection). In case one or more channels cannot be successfully read (e.g., data cannot be recovered from one or more channels), the parity information may be used to recover the original data stream. For example, one extra channel in a RAID-5 configuration may provide recover support if one channel fails and two extra channels in a RAID-6 configuration may provide recover support if two channels fail. In an embodiment, the ECC engine may be a multi-core ECC engine or a super ECC engine to provide fast processing time of ECC codewords.

FIG. 1 schematically shows an exemplary multi-channel NAND storage device 100 according to an embodiment. The NAND storage device 100 may comprise a plurality of channels CH(1), CH(2), through CH(M+F) (a total of M+F channels). Each channel may comprise a plurality of dies. For example, the channel CH(1) may comprise N dies: 102.1, 102.2, 102.3, 102.4, and so on through 102.N; the channel CH(2) may comprise N dies: 104.1, 104.2, 104.3, 104.4, and so on through 104.N; and the channel CH(M+F) may comprise N dies: 106.1, 106.2, 106.3, 106.4, and so on through 106.N. The number N may represent a total number of dies in one channel. Therefore, the M+F channels may comprise (M+F) multiplied by N ((M+F)×N) dies. In an embodiment, the number N may be an integer larger than one, such as, but not limited to, 2, 4, 6, 8, or more, and not necessarily an even number. It should be noted that the M+F channel NAND device 100 may be just an example for a more general multi-channel embodiment, in which M may be an integer larger than one, such as, but not limited to, 2, 4, 6, 8, 10, 12, etc. In some embodiments, M may not necessarily be an even number, for example, M may be 3, 5, 7, 9, etc. The number F may be an integer equal to or larger than one. For example, in a RAID-5 configuration, F may be one; in a RAID-6 configuration, F may be two. Moreover, FIG. 1 shows that each channel may have a bandwidth of K bits, where K may be an integer larger than one, such as, but not limited to, 2, 4, 8, 16, or any suitable number.

Figure 2:
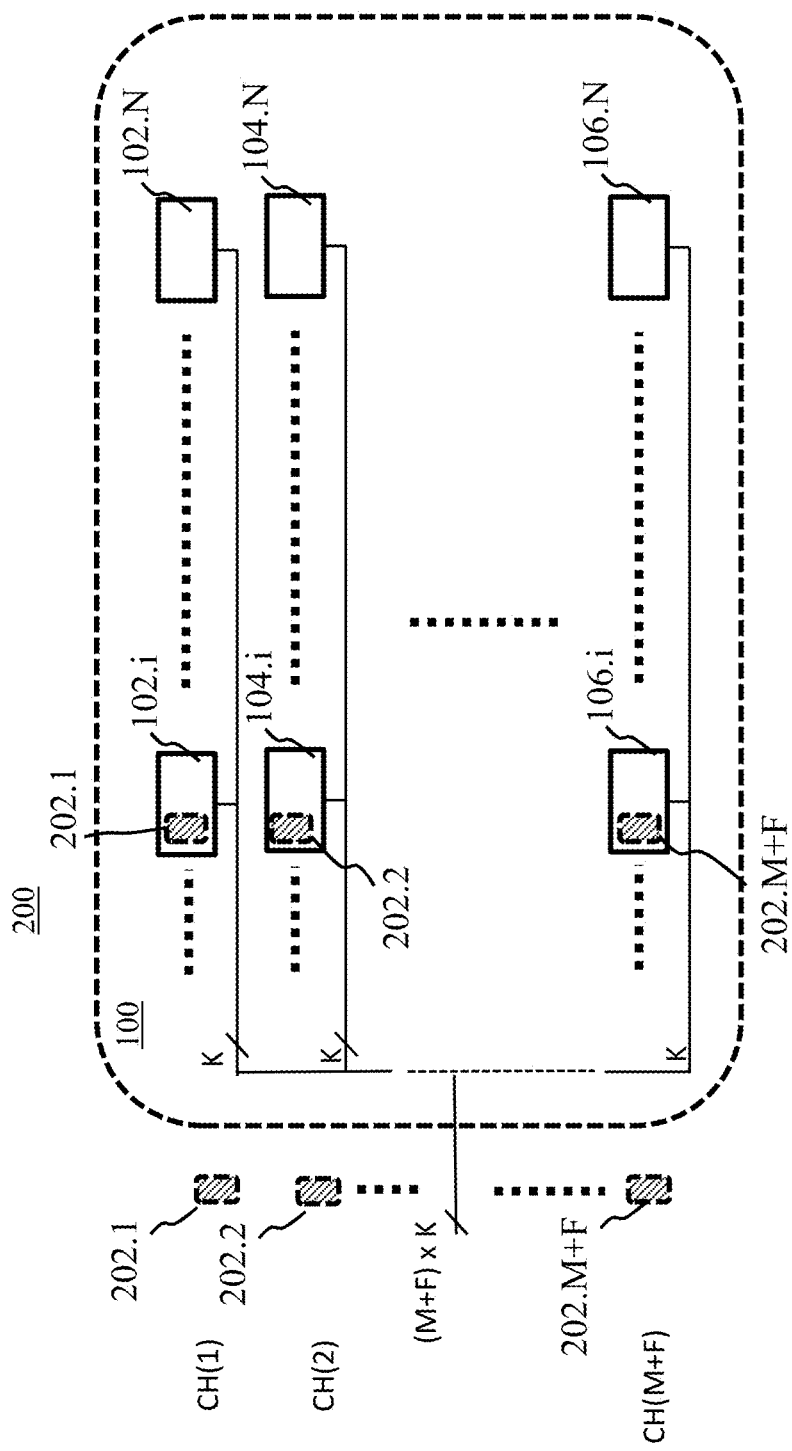
FIG. 2 schematically shows a plurality of data ECC codewords being stored in a multi-channel non-volatile storage device in accordance with an embodiment of the present disclosure.

FIG. 2 schematically shows a storage system 200 with a plurality of data pieces being stored in a multi-channel NAND storage device in accordance with an embodiment of the present disclosure. The storage system 200 may comprise a NAND storage device such as the NAND storage device 100 shown in FIG. 1. The NAND storage device may be coupled to a storage system controller (not shown) via a super channel (also may be referred as a super bus) of a bandwidth (M+F)×K bits, where M+F may be the number of channels of the NAND storage device and K may be the bandwidth of each channel. During a program operation (also known as a write operation), a plurality of data pieces 202.1, 202.2, through 202.M+F may be received via the super channel and spread to different dies of the M+F channels. For example, the data piece 202.1 may be stored in die 102.$i$ of channel CH0, the data piece 202.2 may be stored in die 104.$i$ and the data piece 202.M+F may be stored in die 106.$i$, and so on, where the index "i" may denote one of N dies of a channel. In an embodiment, the index "i" may be determined during operation depending on the available space on the dies to accommodate the data to be stored.

The plurality of data pieces 202.1, 202.2 through 202.M+F may comprise M ECC codewords (also may be referred to as m codewords or M codewords) and F ECC parity blocks. The M codewords may correspond to M data chunks of one user data unit with each data chunk being 1/M of a user data unit. Each user data unit may be an operational unit of a data stream received from a host, which may be L KB (e.g., 1 KB, 2 KB, 4 KB, etc.). For example, a data stream may comprise one or more user data units of L KB and each user data unit may be divided into M data chunks. In some embodiments that implement RAID-5, a parity block may be generated by an XOR operation on the M data chunks of one user data unit. And the ECC parity block may be generated by ECC encoding the parity block. In some other embodiments that implement RAID-5, the ECC parity block may be generated by an XOR operation on the M codewords. In some embodiments that implement RAID-6, two parity blocks may be generated on the M data chunks of one user data unit. And two ECC parity blocks may be generated by ECC encoding the two parity blocks. In some other embodiments that implement RAID-6, two ECC parity blocks may be generated on the M codewords. Therefore, in various embodiments, an original user data unit may be spread into different channels and each partition may be protected by an ECC codeword separately, and the error probability that the original user data unit cannot be recovered because of one channel failure may be reduced. Moreover, the parity information in one or more extra channels may provide protection to the M-channel ECC data and thus further enhance the ECC reliability and robustness.

Even though the example above describes one or two extra channels to supplement the M channels, the same technique can be applied to more extra channels. In a general configuration, there will be a total of M+F channels, where each user data unit may be divided into M data chunks and encoded to M ECC codeword; F ECC parity blocks may be generated according to the M data chunks or the M ECC codewords. F being one using RAID-5 algorithm and F being two using RAID-6 algorithm may be two specific embodiments.

Regardless of how the ECC parity block(s) may be generated, each of the M codewords and the ECC parity block(s) may be stored in any channel with one data piece in each channel. In some embodiments, channel assignments for the M codewords and the parity block(s) may be selected such that the codewords and ECC parity blocks for different user data units may be evenly distributed in all M+F channels. In one embodiment with a RAID-5 implementation, for example, the M codewords for a first user data unit may be spread in a first group of M channels and the ECC parity block for the first user data unit may be stored in an extra channel; M codewords for the second user data unit may be spread in a second group of M channels and the ECC parity block for the second user data unit may be stored in an extra channel; and so on, with the groups of M channels and the extra channel being shifted between different user data units. In another embodiment, the channels for the M codewords and the ECC parity block for each user data unit may be selected using an algorithm by a storage controller in a random or pseudo random manner. In these embodiments, the storage controller may keep track of positions of the codewords and ECC parity blocks (e.g., by algorithm, storing position information, or both).

Although not shown, each die of a NAND storage device may comprise a plurality of pages, which may be arranged in one or more planes. In some embodiments, programming of a NAND storage device may be page based. That is, data may be programmed to the physical storage (e.g., dies of M+F channels) on a page by page process with one page being the smallest unit of programming. In one embodiment, a controller for the NAND storage device may provide a suspension mode of operation such that data may be buffered at the controller such that M+F pages of data (e.g., enough data to fill M+F separate pages in M+F different dies of M+F channels) may be programmed to the NAND storage device in one program operation with each page of data be programmed in one die of a different channel. In another embodiment, the suspension mode may not be provided by a controller for the NAND storage (e.g., disabled or not implemented), and padding may be provided such that data may be programmed to the NAND storage device even if the data cannot fill M+F pages (e.g., with padding for unfilled storage cells of a page).

Figure 3:
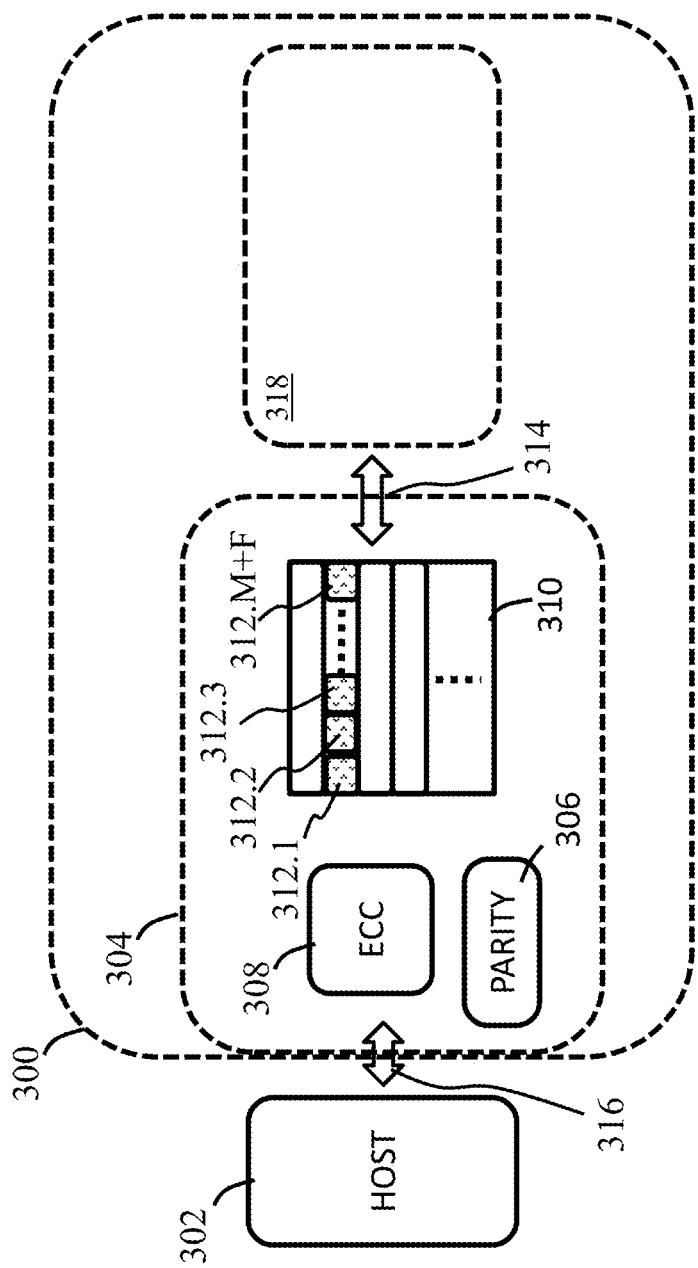
FIG. 3 schematically shows a non-volatile storage system in accordance with an embodiment of the present disclosure.

FIG. 3 schematically shows a storage system 300 in accordance with an embodiment of the present disclosure. The storage system 300 may comprise a storage controller 304 and a NAND storage device 318. The NAND storage device 318 may be an embodiment of the NAND storage device 100. The storage controller 304 may be coupled to a host 302 via an interface 316. The interface 316 may be one of many currently used or yet to be developed interfaces, such as, but not limited to, Serial AT Attachment (SATA), Parallel ATA (PATA), PCI Express (PCI-E), Secure Digital (SD), Universal Serial Bus (USB), etc. The storage system 300 may be implemented in memory cards, USB flash drives and solid-state drives in various embodiments to provide non-volatile storage for the host 302. In some embodiments, the host 302 may be a computing device, such as, but not limited to, a smart phone, a pad computing device, a desktop computer, a laptop computer, a server computer, etc.

The storage controller 302 may further be coupled to the NAND storage device 318 via a second interface 314. The second interface 314 may be a channel interface configured to distribute data pieces (including M ECC codewords and F ECC parity block(s)) for a user data unit to the channels for a write operation and retrieve the data pieces from the channels for a read operation. In some embodiments, the interface 314 may also be designed to monitor and synchronize data traffic on M+F channels, and locate the first set of available aligned pages across M+F channels for (M+F)×Q pages of data to be stored, where Q may be the number of outstanding logical command(s) from the host 302. In one embodiment, Q may correspond to the number of page read or write command from the host 302.

In addition to the interface 316 and the second interface 314, the controller 304 may further comprise a parity generation block 306, an ECC engine 308 and a storage buffer 310. The parity generation block 306 may be a circuit block configured to generate parity information for user data units during write operations (also may be referred to as program operations). Moreover, the parity generation block 306 may be configured to recover a user data unit if one or more data pieces retrieved from one channel fail to be decoded successfully during a read operation. In one embodiment, the parity generation block 306 may be configured to perform one parity operation (e.g., an XOR operation for a RAID-5 configuration). In another embodiment, the parity generation block 306 may be configured to perform two different parity operations (e.g., two parity operations for a RAID-6 configuration).

The ECC engine 308 may be configured to encode data from the host 302 into ECC codewords to be stored in the NAND storage device 318 and decode ECC codewords retrieved from the NAND storage device 318 into data for the host 302. In an embodiment, the ECC engine 308 may be a multi-core engine. In another embodiment, the ECC engine 308 may be a super engine. In both embodiments, the ECC engine 308 may have an ultra-high bandwidth to serve multi-channel data traffic.

In some embodiments, the storage buffer 310 may be a memory bank with high bandwidth. In one embodiment, the storage buffer 310 may be shared with both write ("PROG") and READ paths due to the fact that one physical channel can be occupied by either PROG or READ data traffic. During a program operation, the storage buffer 310 may temporarily store the encoded data, for example, the M ECC codewords and F ECC parity block(s) 312.1 through 312.M+F, before these codewords and the F ECC parity block(s) may be transmitted to the channels of the NAND storage device 318. During a read operation, the storage buffer 310 may be used to temporarily store the data pieces retrieved from the channels.

Figure 4A:
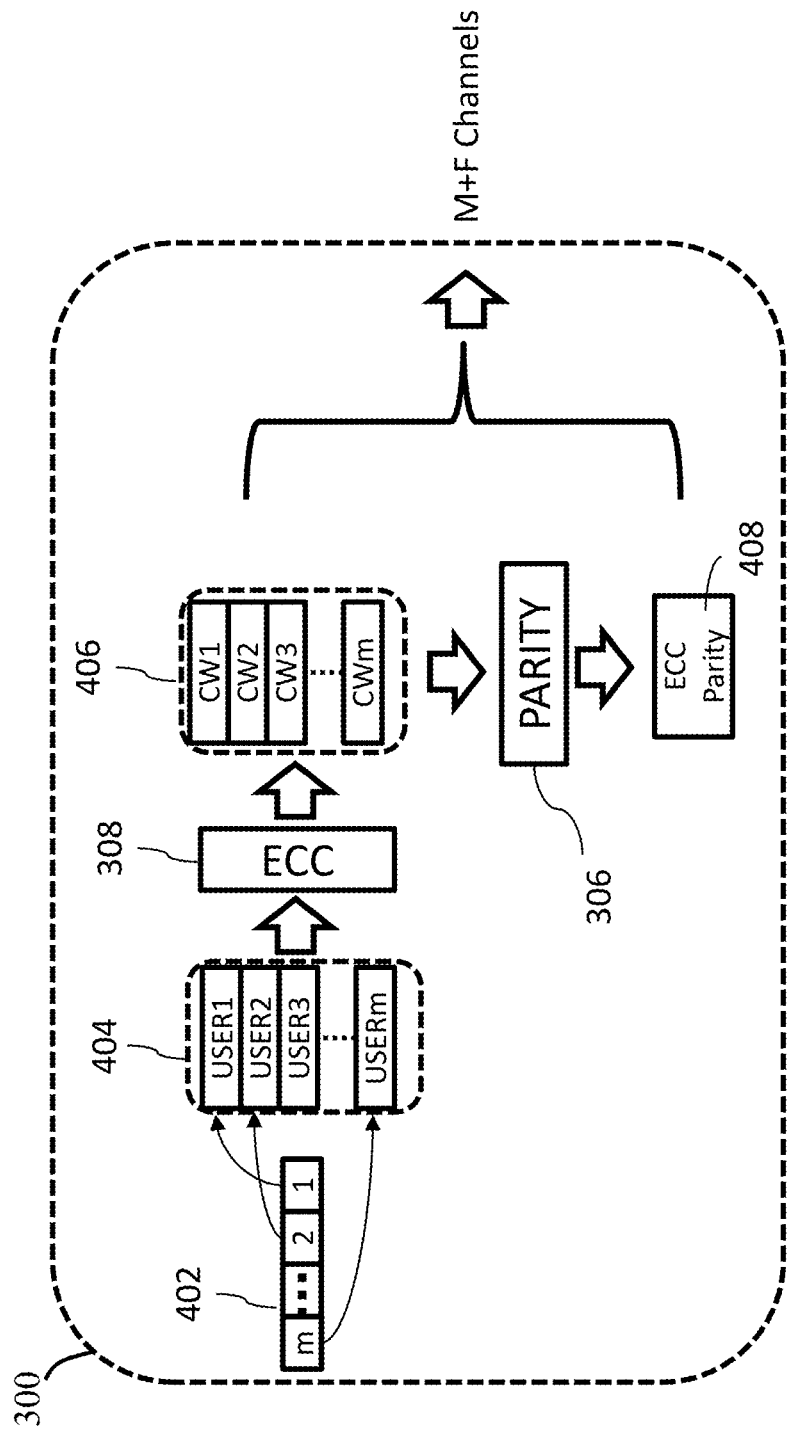
FIG. 4A schematically shows a storage controller processing a user data unit for storage in accordance with an embodiment of the present disclosure.

FIG. 4A schematically shows how a user data unit may be processed for storage by an exemplary storage controller 304 in accordance with one embodiment. During a program operation, a user data unit 402 may be received from a host (e.g., the host 302). The user data unit 402 may be part of a stream of data received from the host for storage. Once received, the user data unit 402 may be divided into a plurality of data chunks 404. Each of the plurality of data chunks 404 may be denoted as USER1, USER2, USER3 through USERm (with m corresponding to M channels to be used to store the user data unit 402). The ECC engine 308 may encode the plurality of data chunks 404 into a plurality of ECC codewords 406. Each of the plurality of ECC codewords 406 may be denoted as CW1, CW2, CW3, through CWm, with each ECC codeword CWi corresponding to a data chunk USERi ("i" being an index representing any number from 1 to m). The parity generation block 306 may generate parity information for the plurality of codewords 406 and the generated parity information may be represented as F ECC parity block(s) 408 (one ECC parity block 408 shown as an example). The plurality of ECC codewords 406 and the F ECC parity block(s) 408 may be transmitted to the channels of a NAND storage device (e.g., the NAND storage device 318). Thereafter, m+F data pieces (including the m codewords corresponding to m data chunks of a user data unit and F ECC parity block(s)) may be stored into M+F dies across M+F channels of a NAND storage device.

Figure 4B:
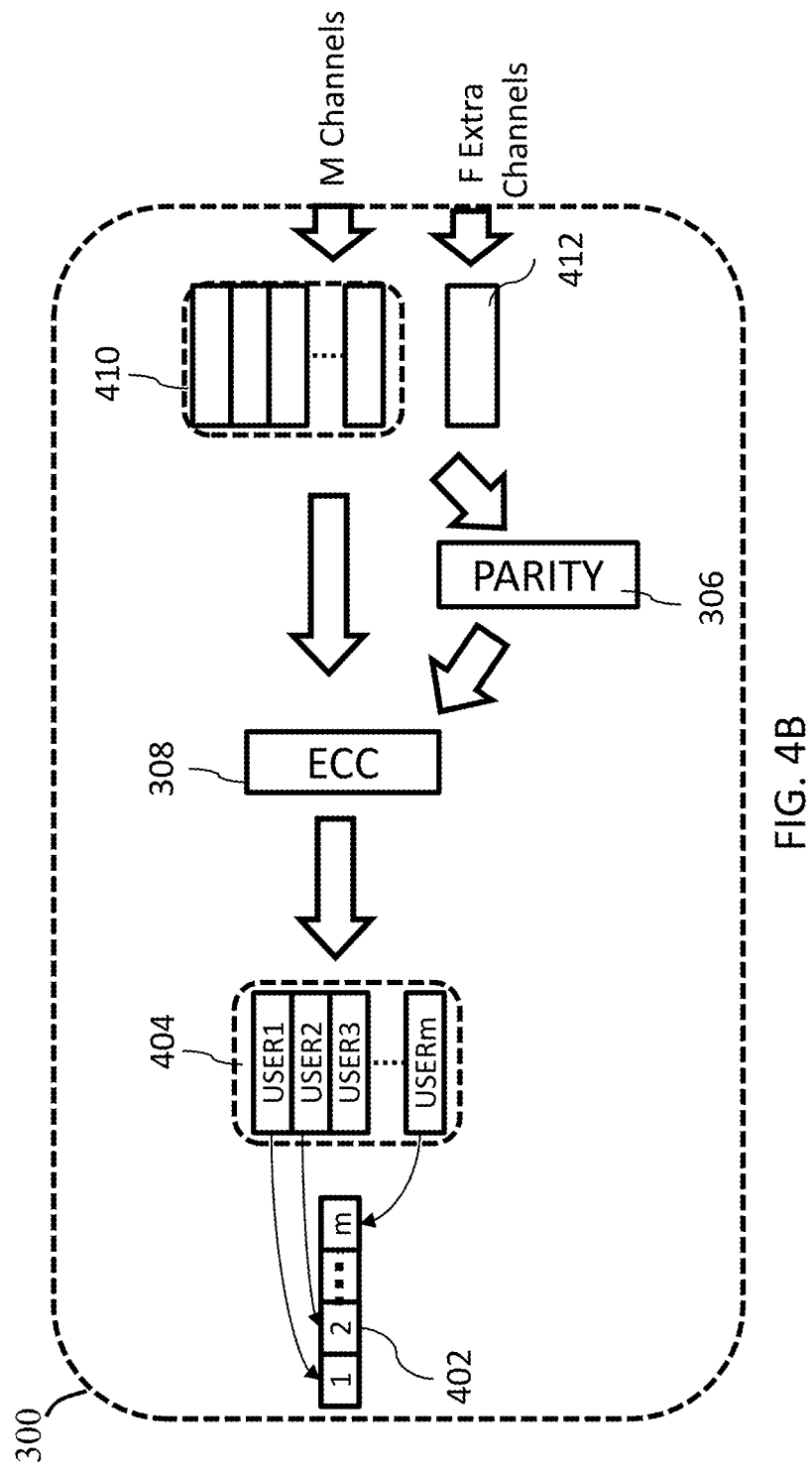
FIG. 4B schematically shows a storage controller processing ECC codewords from storage in accordance with an embodiment of the present disclosure.

FIG. 4B schematically shows how ECC codewords from storage may be processed for a read operation by an exemplary storage controller 304 in accordance with one embodiment. During a read operation, a plurality of data pieces may be read from a NAND storage device (e.g., the NAND storage device 318). The plurality of data pieces may include m data pieces 410 received from a group of M channels and F data piece(s) 412 (one data piece 412 shown as an example) received from the F extra channels. The storage controller 304 may have position information of the m ECC codewords among the plurality of (M+F) channels (e.g., by keeping track of position information, an algorithm, or both) and may be configured to select and send the m ECC codewords to the ECC engine 308. The ECC engine 308 may decode the m ECC codewords and generate the whole set of user data chunks 404. In a RAID-5 configuration for example, if one of the m ECC codewords fails to be decoded by the ECC engine 308, the corresponding user data chunk cannot be generated and may be missing from the whole set of the user data chunks 404. The data piece 412 and other m−1 (m minus one) ECC codewords may be used by the parity generation block 306 to recover the failed ECC codeword. And the recovered ECC codeword may be used by the ECC engine 308 to generate the missing user data chunk to complete the whole set of the user data chunks 404. Once the whole set of the user data chunks 404 may be completed, the user data unit 402 may be generated and sent to a host (e.g., the host 302 or a different host). In a RAID-6 configuration for another example, two failed ECC codewords may be recovered and the recovered ECC codewords may be used by the ECC engine 308 to generate the missing user data chunk to complete the whole set of the user data chunks 404.

In some embodiments, the data piece(s) 412 may not be needed in an initial read. For example, in one embodiment, only m data pieces may be read from the group of m channels during an initial read and the data piece(s) 412 may not be read. If these m data pieces are the m ECC codewords, then the m data pieces may be decoded by the ECC engine 308 to generate the whole set of user data chunks. If m data pieces include m minus P (m−P) ECC codewords and P ECC parity block(s) 408, the parity generation block 306 may be used to generate the P missing ECC codewords from the m-P ECC codewords and P ECC parity block(s) 408. As used herein, P may be an integer equal to or less than F. In either case, if the ECC engine 308 successfully decodes the m ECC codewords, the data piece(s) 412 may not be needed for this read operation and the extra channels may be skipped for reading. Therefore, even if one or more channels (up to F channels) among the M+F channels are damaged, the user data unit may still be recovered.

One or more data pieces 412 may be read from the extra channels if the ECC engine 308 fails to decode all m ECC codewords. If the m data pieces read from the group of m channels are the m ECC codewords, the data piece(s) 412 may be the ECC parity block(s) 408. If P (up to F) ECC codeword of the m data pieces fail to be decoded, these ECC codewords may be recovered by P parity operations using the parity generation block 306 on the remaining ECC codewords and P ECC parity blocks 408 once P ECC parity blocks 408 may be read from the extra channel. And the recovered P ECC codeword may be decoded by the ECC engine 308 to complete the whole set of user data chunks 404.

If the m data pieces read from the group of m channels include m-P ECC codewords and P ECC parity blocks 408, then F data pieces 412 from the F extra channels may include the P ECC codewords missing from the m ECC codewords and F minus P (F−P) ECC parity blocks 408. Initially, the missing ECC codewords may be obtained by parity operations using the parity generation block 306 on the m-P ECC codewords and P ECC parity blocks 408. If one or more of P ECC parity blocks 408 contain errors such that the missing P ECC codewords obtained by parity operation fail to be decoded, P data piece(s) 412 may be read from F extra channels and decoded by the engine 308 to help resolve this problem.

If one or more codewords of the m-P ECC codewords of the m data pieces may be erroneous and fail to be decoded by the ECC engine 308, the P missing ECC codewords obtained by parity operation may also be erroneous and fail to be decoded by the ECC engine 308. In this case, up to F data pieces 412 may be read from the F extra channels and used by the parity generation block 306 to recover the erroneous ECC codewords of the m-P ECC codewords and obtain any missing ECC codewords. And the recovered ECC codewords and obtained missing ECC codewords may be decoded by the engine 308 to resolve the ECC decoding failures. In any event, up to F failures among M+F channels may be recoverable and the originally stored data may be obtained during a read operation.

Figure 5A:
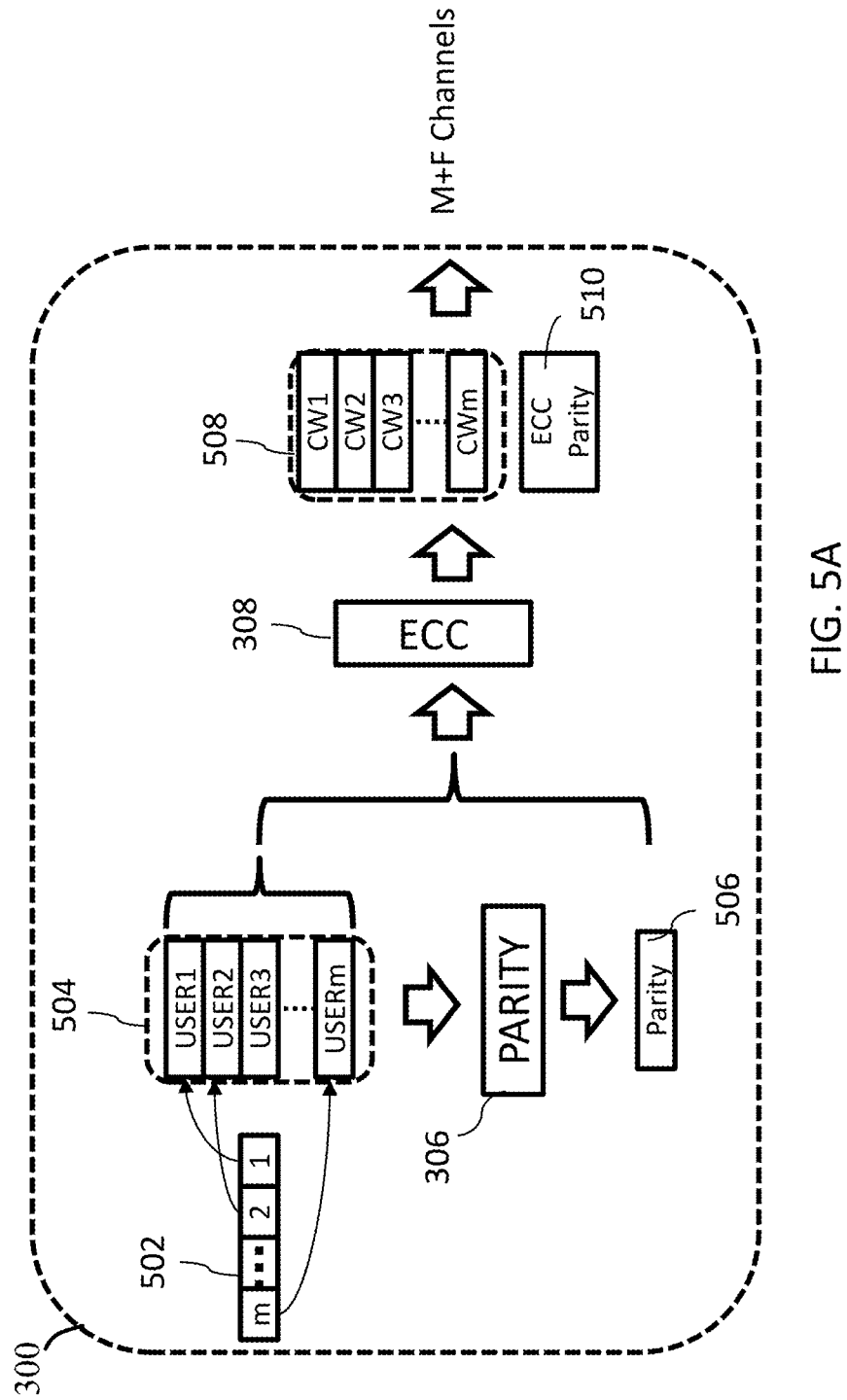
FIG. 5A schematically shows a storage controller processing a user data unit for storage in accordance with another embodiment of the present disclosure.

FIG. 5A schematically shows how a user data unit may be processed for storage by an exemplary storage controller 304 in accordance with another embodiment. During a program operation, a user data unit 502 may be received from a host (e.g., the host 302) and the user data unit 502 may be broken into a plurality of data chunks 504. Each of the plurality of data chunks 504 may be denoted as USER1, USER2, USER3 through USERm (with m corresponding to M channels to be used to store the user data unit 502). The parity generation block 306 may generate parity information for the plurality of data chunks 504 and the generated parity information may be represented as F parity blocks 506 (with one parity block 506 shown in FIG. 5A as an example). The ECC engine 308 may encode the plurality of data chunks 504 into a plurality of ECC codewords 506 and encode the parity block(s) 506 into F ECC parity blocks 510 (with one ECC parity block 510 shown in FIG. 5A as an example). Each of the plurality of ECC codewords 508 may be denoted as CW1, CW2, CW3, through CWm, with each ECC codeword CWi corresponding to a data chunk USERi ("i" being an index representing any number from 1 to m). The plurality of ECC codewords 508 and the ECC parity block(s) 510 may be transmitted to the channels of a NAND storage device (e.g., the NAND storage device 318). Thereafter, m+F data pieces (including the m codewords 508 encoded from m data chunks and F ECC parity blocks 510 encoded from the parity blocks 506) may be stored into M+F dies across M+F channels of a NAND storage device (e.g., the NAND storage device 318).

Figure 5B:
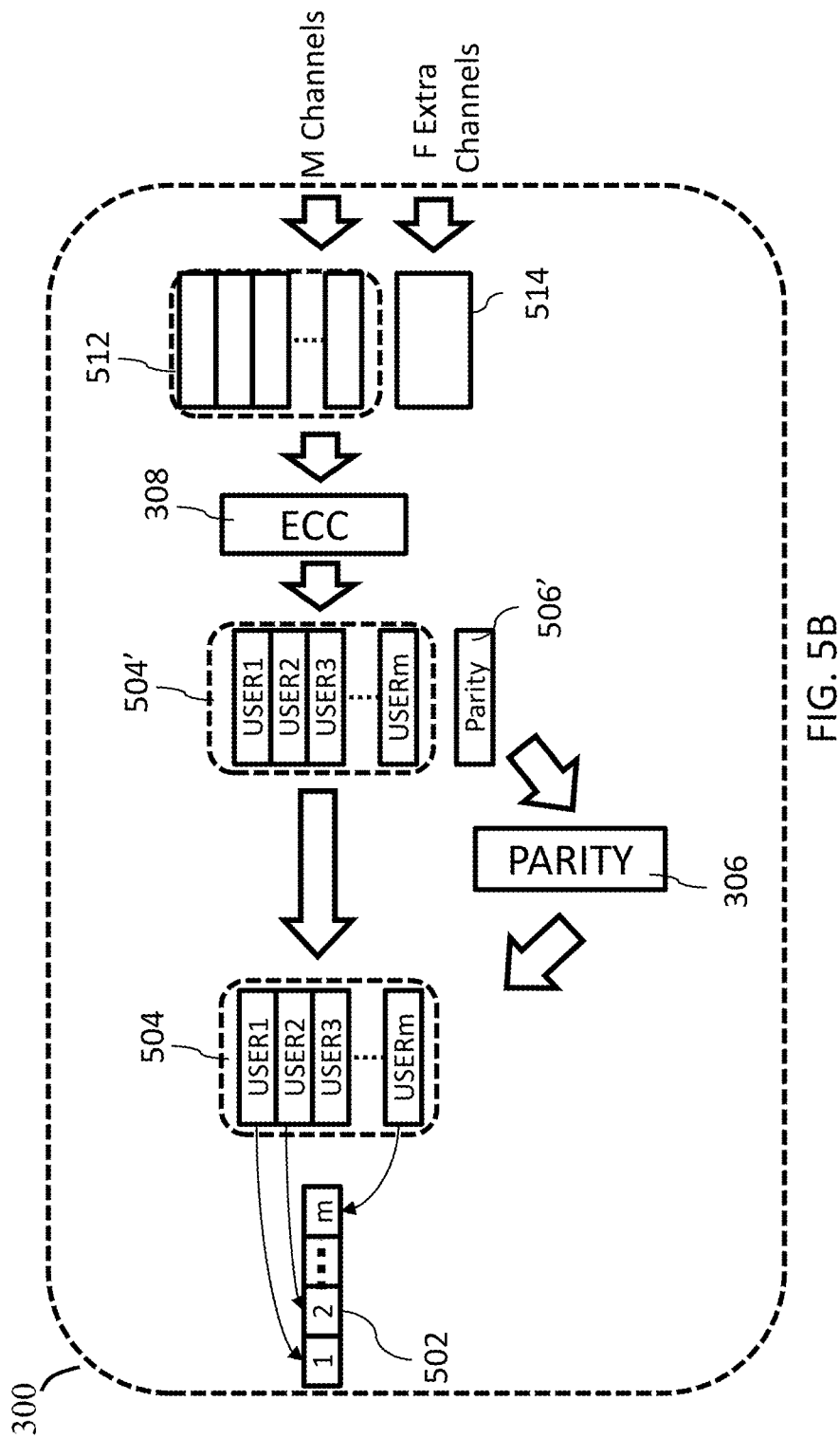
FIG. 5B schematically shows a storage controller processing ECC codewords from storage in accordance with another embodiment of the present disclosure.

FIG. 5B schematically shows how ECC codewords from storage may be processed for a read operation by an exemplary storage controller 304 in accordance with another embodiment. During a read operation, a plurality of data pieces may be read from a NAND storage device (e.g., the NAND storage device 318). The plurality of data pieces may include m data pieces 512 received from a group of M channels and F data pieces 514 received from the F extra channels. The storage controller 304 may be configured to send the m data pieces 512 and the extra data pieces 514 to the ECC engine 308. The m data pieces 512 and F extra data pieces 514 may include the m ECC codewords 508 and F ECC parity blocks 510. The ECC engine 308 may decode the m ECC codewords 508 and generate the set of user data chunks 504', and decode the ECC parity blocks 510 and generate the parity blocks 506'. If the ECC codewords decoding is performed successfully, the user data chunks 504's generated by the ECC engine 308 is the same as the original user data units set 504. The storage controller 304 may have position information of the m ECC codewords among the plurality of (M+F) channels (e.g., by keeping track of position information, an algorithm, or both) and use that information to generate the user data unit 502. If P ECC codeword fails to be decoded successfully by the ECC engine 308, the user data chunks 504' may miss P user data chunks. In this case, parity operation(s) may be performed on the m-P user data chunks and P parity blocks 506' by the parity generation block 306 to generate the missing user data chunks. Once the whole set of the user data chunks 504 may be completed, the user data unit 502 may be generated and sent to a host (e.g., the host 302 or a different host).

In some embodiments, none of data pieces 514 may be needed in an initial read. For example, in one embodiment, only m data pieces may be read from the group of m channels during an initial read and none of the data pieces 514 is read. If m data pieces correspond to m ECC codewords, then the m data pieces may be decoded by the ECC engine 308 to generate the set of user data chunks 504'. If the ECC engine 308 successfully decodes the m ECC codewords, none of the data pieces 514 is needed for this read operation and all F extra channels may be skipped for reading. If m data pieces include m-P ECC codewords and P ECC parity blocks 510, and the m data pieces are decoded by the ECC engines 308 successfully, then the missing user data chunks may be recovered by the parity generation block 306 using the m-P user data chunks 504' and P parity blocks 506'. In this case, none of the data piece 514 is needed for this read operation either and all F extra channels may be skipped for reading as well.

If, however, P of the m data pieces 512 fail to be decoded successfully by the engine 308, P data pieces 514 may be read from the F extra channels and decoded by the engine 308. Each of the data pieces 514 after being decoded may be a missing user data chunk 504' or a parity block 506'. If it is a missing user data chunk 504', it may be used directly to complete the set of user data chunks 504. If it is a parity block 506', a missing user data chunk 504 may be recovered using the parity generation block 306 with user data chunks 504' and parity block(s) 506' already successfully generated. Therefore, even if up to F channels among the M+F channels are damaged, the user data unit may still be recovered.

Figure 6:
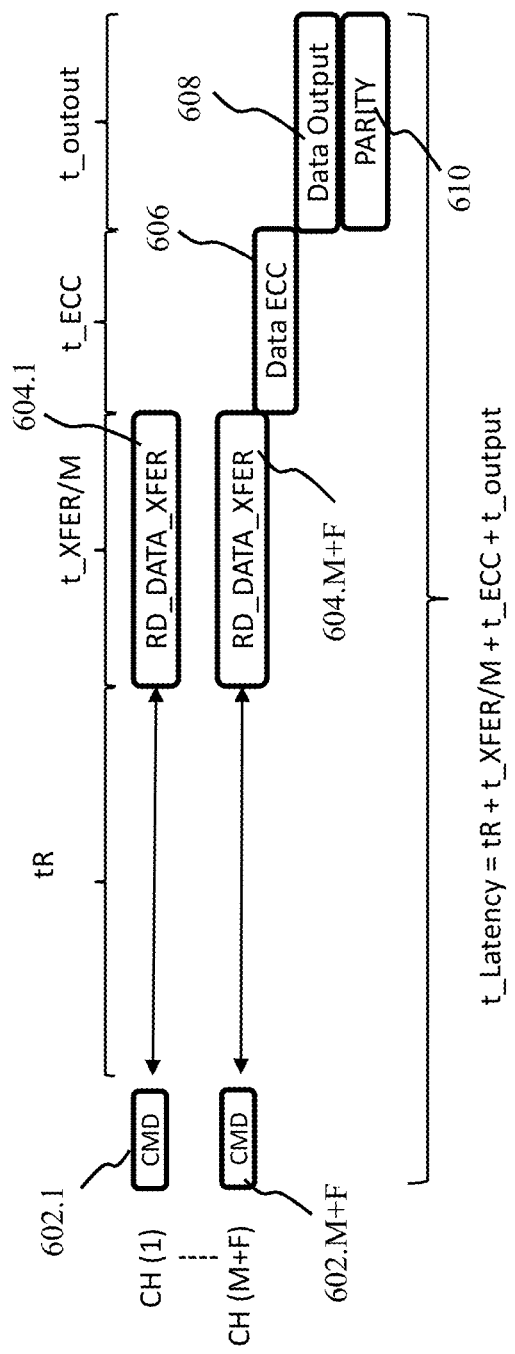
FIG. 6 schematically shows latency for a non-volatile storage system in accordance with an embodiment of the present disclosure.

FIG. 6 schematically shows latency for a non-volatile storage system to perform a read operation in accordance with an embodiment of the present disclosure. Read commands, for example CMD 602.1 through CMD 602.M+1, may be issued on M+F channels CH(1) through CH (M+F) respectively. Each channel may take a period of time tR to get ready to transfer data, which may be determined by non-volatile memory devices. In contrast to a convention system that may need a period of time t_XFER to retrieve data pieces for a data unit and transfer them to a controller, each of the plurality of channels CH(1) through CH(M+F) may take a period of time t_XFER/M for operations RD_DATA_XFER 604.1 through RD_DATA_XFER 604.M+F to transfer respective data pieces to a controller.

Therefore, although t_XFER may be limited by Interface speed, dividing a user data unit into m partitions may help reduce the transfer time by a factor of m.

The controller may invoke an ECC engine as soon as M+F data pieces of a data unit have been received and the ECC engine may generate an ECC output 606 after a period of time t_ECC. By dividing a user data unit into m partitions, each partition may be protected by a shorter ECC codeword (compared to a long ECC codeword for the user data unit without partition) that may need less time to for encoding/decoding operations. And the t_ECC may be further reduced by using a super ECC engine in some embodiments that may perform encoding/decoding really fast or a multi-core ECC engine in some other embodiments that may perform multiple encoding/decoding in parallel. In some embodiments, if one or more m ECC codewords fail to be decoded successfully, the missing user chunks may be recovered by parity operation on the other successfully decoded user data chunks and decoded parity blocks. The parity-based recovery time or latency for the parity operation 610 may be hidden during the data output 608 period of time t_output and no extra latency is introduced. The final data output 608 may thus be generated after a latency of t_Latency=tR+t_XFER/M+t_ECC+t_output. In contrast, a conventional NAND storage system may generate an output after a latency of tR+t_XFER+t_ECC+t_output.

The period of time tR for different channels may be different, therefore waiting for all M+F data pieces to be ready may delay the starting of the ECC engine. In one embodiment, the controller may invoke an ECC engine as soon as any data piece out of M+F data pieces of a data unit have been received. In some embodiments, the data synchronization circuitry may be simplified and the effect of the variation of tR from different channels may be used to keep the system overall latency as low as possible by starting the decoding operation on data pieces from the fastest channels. In one embodiment, for example, the first M data pieces from the fastest M channels may be decoded. The decoded data pieces may correspond to a subset of the plurality of data chunks and at least one parity block. And the parity generation circuit block may perform at least one parity operation on the subset of the plurality of data chunks and the at least one parity to obtain at least one data chunk to complete a whole set of the plurality of data chunks for a user data unit. The remaining F data pieces from remaining F of M+F channels may be used to provide a recovery support, for example, if up to F data pieces out of M+F data pieces may fail to be decoded successfully.

FIG. 7 is a flowchart of a process 700 for programming a multi-channel non-volatile storage device in accordance with an embodiment of the present disclosure. In block 702, a user data unit may be divided into a plurality of data chunks. For example, a stream of data may be received at a storage controller from a host. The stream of data may include one or more user data units. Each user data unit may be divided into a plurality of data chunks. In block 704, a plurality of error correction code (ECC) codewords and at least one ECC parity block may be generated. In general, F parity blocks may be used. For example, in a RAID-5 configuration, one parity block may be used; and in a RAID-6 configuration, two parity blocks may be used. In one embodiment, each of the plurality of ECC codewords may be generated by encoding a respective data chunk of the plurality of data chunks. The ECC parity blocks may be generated by generating parity data chunks from the plurality of data chunks using parity generation operations and encoding the parity data chunks to generate the ECC parity blocks. In another embodiment, each the plurality of data chunks may be encoded respectively to generate individual ECC codeword of the plurality of ECC codewords, and the ECC parity blocks may be generated by parity generation operations on the plurality of ECC codewords.

In block 706, the plurality of ECC codewords and the at least one ECC parity block may be transmitted to a plurality of channels of the non-volatile storage device for each of the plurality of ECC codewords and the at least one ECC parity block to be stored in a different channel of the plurality of channels. In one embodiment, each channel of the non-volatile storage device comprises a plurality of dies, and each of the plurality of ECC encoded codewords and F ECC parity blocks may be stored in a different die of a different channel. In various embodiments, the non-volatile storage device may be a NAND flash memory, a NOR flash memory, a magnetoresistive random Access Memory (MRAM), a resistive random access memory (RRAM), a phase change random access memory (PCRAM), or a Nano-RAM.

It should be noted that the encoded data to be programmed into each corresponding channel may need to be aggregated into a minimum size required according to the types of non-volatile storage devices before being programmed into each channel. Moreover, if program data is not enough to meet the minimum size required by a corresponding type of non-volatile storage device, dummy data may be padded to complete the program operation.

Because the original user data unit may be divided into M data chunks that each may be individually protected by an ECC codeword and also distributed into a different channel, the overall ECC robustness is enhanced. Furthermore, one or more extra channels may be used to store parity information so that RAID technology may be used to further improve the durability of the data stored in each channel. In one embodiment, parity generation operations may be performed on the M encoded data pieces (also referred to as M codewords) to generate the (M+1)th through (M+F)th RAID parity data pieces at the output of M parallel encoders (therefore, no extra latency is introduced). The generated RAID parity data pieces may be then programmed into F of the M+F channels along with the M codewords being programmed into the other M channels. In another embodiment, parity generation operation may be performed on M data chunks in parallel to generate (M+1)th through (M+F)th RAID parity data blocks at the input of the M parallel encoders (therefore, no extra latency is introduced). The generated F RAID parity blocks may be then encoded to generate F ECC parity blocks to be programmed into F of the M+F channels along with the M codewords being programmed into the other M channels. In some embodiments, the program operation of F ECC parity blocks into F channels does not affect the normal operations on the other M channels.

FIG. 8 is a flowchart of a process 800 for reading data from a multi-channel non-volatile storage device in accordance with an embodiment of the present disclosure. In block 802, data pieces including the plurality of ECC codewords and at least ECC parity block may be read from channels of a non-volatile storage device in parallel. For example, a read command from a host may be converted into a plurality of read operations at a storage controller and the plurality of read operations may be performed on a plurality of channels of a non-volatile storage device (e.g., a multi-channel NAND storage device) in parallel. Data pieces including a plurality of ECC codewords corresponding to a plurality of data chunks of a user data unit and at least one ECC parity block may be received from the plurality of channels of the non-volatile storage device. In block 804, the plurality of ECC codewords may be decoded to generate the plurality of data chunks with the at least one ECC parity block providing a recovery support if one or more of the plurality of ECC codewords fail to be decoded successfully.

In one embodiment, the plurality of ECC codewords may be decoded to generate the plurality of data chunks of a user data unit. If one or more of the ECC codewords fail to be decoded successfully, the at least one ECC parity block may be used to recover the failed ECC codeword if the at least one ECC parity block may have been generated by parity operation(s) using the ECC codewords, or the at least one ECC parity blocks may be decoded first to generate at least one parity block and the at least one parity block may be used to recover the data chunk(s) if the at least one ECC parity block has been generated by ECC encoding of the parity block(s).

In some embodiments, in order to achieve fast read with ultra-low latency, all M+F channels may be read at the same time. The M+F encoded data pieces read from M+F channels may be decoded in parallel by either a super decoder engine or a multi-core decoder engine. Because the M+F encoded data pieces may be decoded at the same time, the incurred ECC latency may be minimized comparing with decoding a long ECC codeword. Moreover, as long as only up to F of the M+F data pieces fail after ECC decoding, the original user data unit may still be successfully recovered without extra ECC latency because parity operation(s) on the other successful decoded data pieces can be operated at the same time of data out transfer.

FIG. 9 is a flowchart of a process 900 for reading data from a multi-channel non-volatile storage device in accordance with another embodiment of the present disclosure. In block 902, M data pieces may be read in parallel from M of a total of M+F channels of the non-volatile storage device. In one embodiment, M ECC codewords may correspond to M data chunks for one user data unit. The M ECC codewords and F ECC parity blocks may be M+F data pieces stored in M+F channels. M may be an integer larger than one and F may be an integer equal to or larger than one. In block 904, it may be determined that the M data pieces may correspond to the plurality of ECC codewords. In block 906, the M data pieces may be decoded to obtain the plurality of data chunks with the at least one ECC parity block providing a recovery support.

FIG. 10 is a flowchart of a process 1000 for reading data from a multi-channel non-volatile storage device in accordance with yet another embodiment of the present disclosure. In block 1002, M data pieces may be read in parallel from M of a total of M+F channels of the non-volatile storage device. The plurality of ECC codewords and at least one ECC parity block may be M+F data pieces stored in M+F channels, in which M may be an integer larger than one and F may be an integer equal to or larger than one. In block 1004, it may be determined that the M data pieces may include at least one ECC parity block. As described herein, in one embodiment, M data pieces may include one or more (up to F) ECC parity blocks. In block 1006, at least one ECC codeword not included in the M data pieces may be obtained by at least one parity operation on the M data pieces. For example, one or more ECC codewords of a plurality of ECC codewords corresponding to one user data may be obtained by parity operations on the M data pieces. In block 1008, the plurality of ECC codewords may be decoded to obtain the plurality of data chunks. For example, when the plurality ECC codewords are all obtained and decoded, the plurality of data chunks for one user data unit may be generated. In one embodiment, if one or more ECC codewords fail to be decoded, F data pieces from the remaining F channels may be used for data recovery.

Figure 11:
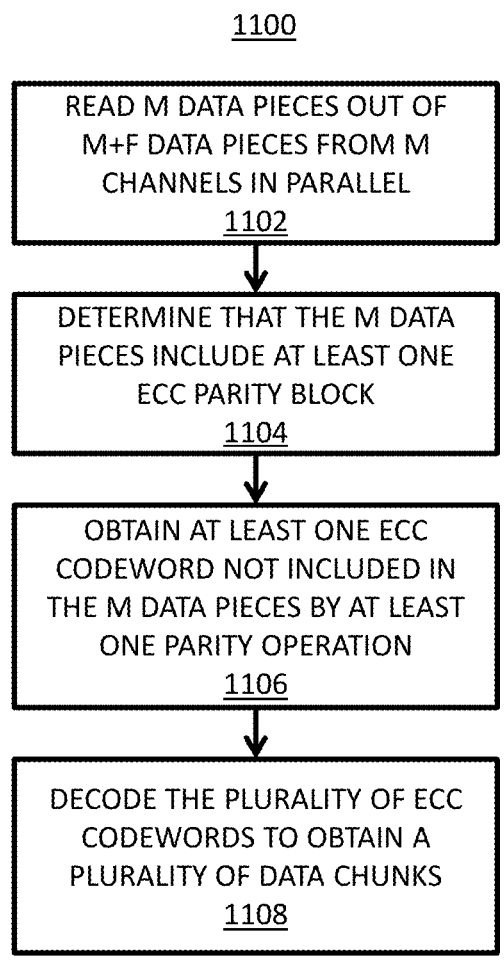
FIG. 11 is a flowchart of a process for reading data from a multi-channel non-volatile storage device in accordance with another embodiment of the present disclosure.

FIG. 11 is a flowchart of a process 1100 for reading data from a multi-channel non-volatile storage device in accordance with a further embodiment of the present disclosure. In block 1102, M data pieces may be read in parallel from M of a total of M+F channels of the non-volatile storage device. The plurality of ECC codewords and the at least one ECC parity block may be M+F data pieces stored in M+F channels, and M may be an integer larger than one and F may be an integer equal to or larger than one. In block 1104, it may be determined that the M data pieces may include the at least one ECC parity block. As described herein, in one embodiment, M data pieces may include one or more (up to F) ECC parity blocks. In block 1106, the M data pieces may be decoded to obtain a subset of the plurality of data chunks and at least one parity block. Because the M data pieces may include one or more (up to F) ECC parity blocks, these M data pieces may only contain a subset of the plurality of ECC codewords for one user data unit and this subset of ECC codewords may only obtain a subset of data chunks for one user data unit. The one or more (up to F) ECC parity blocks may be decoded into one or more parity blocks. In block 1108, at least one data chunk to complete a whole set of the plurality of data chunks may be obtained by at least one parity operation on the subset of the plurality of data chunks and the at least one parity. For example, parity operations may be applied on the subset of data chunks and the one or more parity blocks generated by a decoding process of an ECC engine to obtain missing data chunks. If one or more ECC codewords fail to be decoded, F data pieces from the remaining F channels may be used for data recovery.

The processes 700, 800, 900, 1000 and 1100 may be implemented using software (e.g., executable by a computer processor (CPU, GPU, or both)), hardware (e.g., a field-programmable gate array (FPGA) or an application-specific IC (ASIC), firmware, or any suitable combination of the three. In one embodiment, for example, components of a storage controller may be implemented in hardware circuitry, and the processes 700, 800, 900, 1000 and 1100 may be performed in hardware. In another embodiment, for example, components of a storage controller may be implemented in software. And the processes 700, 800, 900, 1000 and 1100 may be programmed in computer processor executable instructions and performed by a computer processor (e.g., a microprocessor or a microcontroller) executing the executable instructions.

Embodiments may be applied to SSD systems that require high throughput, low latency, and data robustness. Moreover, embodiments may be used to increase the life cycle of the non-volatile storage devices. Furthermore, embodiments may be applied to reduce the overall system access latency including ECC processing latency and data transfer latency, so that a better QoS can be achieved. In some embodiments, the ECC robustness may be improved because data may still be read while up to F channels may be broken. In addition, in at least one embodiment, the overall decoding latency may be reduced because NAND flash re-read can be avoided.

In some embodiments, when retrieving the original user data unit in an exemplary non-volatile storage system, any M channel reads may be sufficient to recover the original user data unit because it is protected by RAID parity on a channel basis. The missing data piece(s) stored in the extra channel(s) may be obtained by parity operation(s). In case of decoding failure, the extra channel(s) may be read. Moreover, in some embodiments, because decoding of each of M or M+F data pieces from corresponding channels may be independent, no data synchronization circuitry may be needed.

In an exemplary embodiment, there is provided a method for storing data in a non-volatile storage device. The method may comprise: dividing a user data unit into a plurality of data chunks, generating a plurality of error correction code (ECC) codewords and at least one ECC parity block and transmitting the plurality of ECC codewords and the at least one ECC parity block to a plurality of channels of the non-volatile storage device for each of the plurality of ECC codewords and the at least one ECC parity block to be stored in different channels of the plurality of channels.

In one embodiment, generating the plurality of ECC codewords and the at least one ECC parity block comprises encoding each the plurality of data chunks respectively to generate individual ECC codeword of the plurality of ECC codewords and generating the at least one ECC parity block by at least one parity operation on the plurality of ECC codewords.

In one embodiment, generating the plurality of ECC codewords and the at least one ECC parity block comprises generating at least one parity data chunk from the plurality of data chunks by at least one parity operation and encoding the at least one parity data chunk to generate the at least one ECC parity block, wherein each of the plurality of data chunks is encoded into a respective ECC codeword of the plurality of ECC codewords In one embodiment, each channel of the non-volatile storage device comprises a plurality of dies, and each of the plurality of ECC codewords and the at least one ECC parity block is stored in a different die of a different channel In one embodiment, the non-volatile storage device is one of: a NAND flash memory, a NOR flash memory, a magnetoresistive Random Access Memory (MRAM), a resistive random access memory (RRAM), a phase change random access memory (PCRAM), and a Nano-RAM.

In one embodiment, the method may further comprise reading the plurality of ECC codewords and the at least one ECC parity block in parallel from the non-volatile storage device, and decoding the plurality of ECC codewords to obtain the plurality of data chunks with the at least one ECC parity block providing a recovery support if one or more of the plurality of ECC codewords fail to be decoded successfully.

In one embodiment, the method may further comprise reading M data pieces in parallel from M of a total of M+F channels of the non-volatile storage device. The plurality of ECC codewords and the at least one ECC parity block may be M+F data pieces stored in M+F channels, and M may be an integer larger than one and F may be an integer equal to or larger than one. The method may further comprise determining that the M data pieces correspond to the plurality of ECC codewords and decoding the M data pieces to obtain the plurality of data chunks with the at least one ECC parity block providing a recovery support.

In one embodiment, the method may further comprise reading M data pieces in parallel from M of a total of M+F channels of the non-volatile storage device. The plurality of ECC codewords and the at least one ECC parity block may be M+F data pieces stored in M+F channels, and M may be an integer larger than one and F may be an integer equal to or larger than one. The method may further comprise determining that the M data pieces include the at least one ECC parity block, obtain at least one ECC codeword not included in the M data pieces by at least one parity operation on the M data pieces, and decoding the plurality of ECC codewords to obtain the plurality of data chunks with F data pieces from remaining F of M+F channels providing a recovery support.

In one embodiment, the method may further comprise reading M data pieces in parallel from M of a total of M+F channels of the non-volatile storage device. The plurality of ECC codewords and the at least one ECC parity block may be M+F data pieces stored in M+F channels, and M may be an integer larger than one and F may be an integer equal to or larger than one. The method may further comprise determining that the M data pieces include the at least one ECC parity block, decoding the M data pieces to obtain a subset of the plurality of data chunks and at least one parity block, and obtaining at least one data chunk to complete a whole set of the plurality of data chunks by at least one parity operation on the subset of the plurality of data chunks and the at least one parity, with F data pieces from remaining F of M+F channels providing a recovery support.

In another exemplary embodiment, there is provided an apparatus that may comprise a first interface to be coupled to a host, a parity generation circuit block configured to generate at least one parity block for a plurality of data chunks of a user data unit received from the host, an error correction code (ECC) engine configured to encode the plurality of data chunks into a plurality of codewords and the at least one parity block into an at least one ECC parity block, and a second interface coupled to a non-volatile storage device to spread the codewords and the at least one ECC parity block across a plurality channels of the non-volatile storage device.

In one embodiment, each channel of the non-volatile storage device comprises a plurality of dies, and each of the plurality of ECC codewords and the at least one ECC parity block is stored in a different die of a different channel.

In one embodiment, the non-volatile storage device may be one of: a NAND flash memory, a NOR flash memory, a magnetoresistive random Access Memory (MRAM), a resistive random access memory (RRAM), a phase change random access memory (PCRAM), and a Nano-RAM.

In one embodiment, during a read operation, the second interface may be configured to read the plurality of ECC codewords and the at least one ECC parity block in parallel from the non-volatile storage device. The ECC engine may be configured to decode the plurality of ECC codewords to obtain the plurality of data chunks of the user data unit, and the parity generation circuit block may be configured to provide a recovery support if at least one of the ECC codewords fails to be decoded successfully.

In one embodiment, during a read operation, the second interface may be configured to read M data pieces in parallel from M of a total of M+F channels of the non-volatile storage device and the ECC engine may be configured to decode the M data pieces to obtain the plurality of data chunks and the parity generation circuit block is configured to provide a recover support if at least one of the M data pieces fails to be decoded successfully. The plurality of ECC codewords and the at least one ECC parity block may be M+F data pieces stored in M+F channels, M may be an integer larger than one and F may be an integer equal to or larger than one, and the M data pieces may correspond to the plurality of ECC codewords.

In one embodiment, during a read operation, the second interface may be configured to read M data pieces in parallel from M of a total of M+F channels of the non-volatile storage device, the ECC engine may be further configured to decode M data pieces to obtain a subset of the plurality of data chunks and at least one parity block and the parity generation circuit block may be further configured to perform at least one parity operation on the subset of the plurality of data chunks and the at least one parity to obtain at least one data chunk for completing a whole set of the plurality of data chunks. The plurality of ECC codewords and the at least one ECC parity block may be M+F data pieces stored in M+F channels, M may be an integer larger than one and F may be an integer equal to or larger than one. The M data pieces may include the at least one ECC parity block and F data pieces from remaining F of M+F channels may provide a recovery support.

In yet another exemplary embodiment, there is provided an apparatus that may comprise a first interface to be coupled to a host, an error correction code (ECC) engine configured to encode the plurality of data chunks into a plurality of codewords, a parity generation circuit block configured to generate at least one ECC parity block from the plurality of codewords, and a second interface coupled to a non-volatile storage device to spread the plurality of codewords and the at least one ECC parity block across a plurality channels of the non-volatile storage device.

In one embodiment, each channel of the non-volatile storage device may comprise a plurality of dies, each of the plurality of ECC codewords and the ECC parity block may be stored in a different die of a different channel, and the non-volatile storage device may be one of: a NAND flash memory, a NOR flash memory, a magnetoresistive random Access Memory (MRAM), a resistive random access memory (RRAM), a phase change random access memory (PCRAM), and a Nano-RAM.

In one embodiment, during a read operation, the second interface may be configured to read the plurality of ECC codewords and the at least one ECC parity block in parallel from the non-volatile storage device, the ECC engine may be configured to decode the plurality of ECC codewords to obtain the plurality of data chunks of the user data unit, and the parity generation circuit block may be configured to provide a recovery support if at least one of the ECC codewords fails to be decoded successfully.

In one embodiment, during a read operation, the second interface may be configured to read M data pieces in parallel from M of a total of M+F channels of the non-volatile storage device, the ECC engine may be configured to decode the M data pieces to obtain the plurality of data chunks and the parity generation circuit block may be configured to provide a recover support if at least one of the M data pieces fails to be decoded successfully. The plurality of ECC codewords and the at least one ECC parity block may be M+F data pieces stored in M+F channels, M may be an integer larger than one and F may be an integer equal to or larger than one, and the M data pieces may correspond to the plurality of ECC codewords, In one embodiment, during a read operation, the second interface may be configured to read M data pieces in parallel from M of a total of M+F channels of the non-volatile storage device, the parity generation circuit block may be further configured to perform at least one parity operation on the M data pieces to obtain remaining codeword(s) of the plurality of codewords stored in F channels of the M+F channels, and the ECC engine may be further configured to decode to the plurality of ECC codewords to obtain the plurality of data chunks. The plurality of ECC codewords and the at least one ECC parity block may be M+F data pieces stored in M+F channels, M may be an integer larger than one and F may be an integer equal to or larger than one, the M data pieces may include the at least one ECC parity block and F data pieces from remaining F of M+F channels may provide a recovery support.

Any of the disclosed methods and operations may be implemented as computer-executable instructions (e.g., software code for the operations described herein) stored on one or more computer-readable storage media (e.g., non-transitory computer-readable media, such as one or more optical media discs, volatile memory components (such as DRAM or SRAM), or nonvolatile memory components (such as hard drives)) and executed on a device controller (e.g., firmware executed by ASIC). Any of the computer-executable instructions for implementing the disclosed techniques as well as any data created and used during implementation of the disclosed embodiments can be stored on one or more computer-readable media (e.g., non-transitory computer-readable media).

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method for storing and retrieving data stored in a non-volatile storage device, comprising:
   transmitting M+F data pieces to M+F channels of the non-volatile storage device for each of the M+F data pieces to be stored in a different channel of the M+F channels, wherein the M+F data pieces include M error correction code (ECC) codewords generated from M data chunks and F ECC parity block(s) generated from F parity block(s), and M is an integer larger than one and F is an integer equal to or larger than one;
   reading M data pieces in parallel from M channels, wherein the M data pieces include a subset of the M ECC codewords and at least one of the F ECC parity block(s);
   decoding the M data pieces to generate a subset of the M data chunks and at least one of the F parity block(s); and
   recovering at least one data chunk of the M data chunks that is missing from the subset of the M data chunks by at least one parity operation on the at least one of F parity block(s) and the subset of the M data chunks.

2. The method of claim 1, wherein each channel of the non-volatile storage device comprises a plurality of dies, and each of the M+F data pieces is stored in a different die of a different channel.

3. The method of claim 1, wherein the non-volatile storage device is one of: a NAND flash memory, a NOR flash memory, a magnetoresistive random Access Memory (MRAM), a resistive random access memory (RRAM), a phase change random access memory (PCRAM), and a Nano-RAM.

4. The method of claim 1, wherein the at least one parity operation includes an XOR operation.

5. The method of claim 1, further comprising:
   reading a second batch of M data pieces in parallel from the M channels;
   decoding the second batch of M data pieces;
   determining that one data piece of the second batch of M data pieces fails to be decoded successfully;
   reading a data piece from one of remaining F channels of the M+F channels;
   decoding the data piece from the one of remaining F channels of the M+F channels to recover a data chunk missing from a second batch of M data chunks.

6. An apparatus, comprising:
   an interface coupled to a non-volatile storage device and configured to:
      transmit M+F data pieces to M+F channels of the non-volatile storage device for each of the M+F data pieces to be stored in a different channel of the M+F channels, wherein the M+F data pieces include M error correction code (ECC) codewords generated from M data chunks and F ECC parity block(s) generated from F parity block(s), and M is an integer larger than one and F is an integer equal to or larger than one; and
      read M data pieces in parallel from M channels, wherein the M data pieces include a subset of the M ECC codewords and at least one of the F ECC parity block(s);
   an error correction code (ECC) engine coupled to the interface and configured to decode the M data pieces to generate a subset of the M data chunks and at least one of the F parity block(s); and
   a parity generation circuit block coupled to the ECC engine and configured to recover at least one data chunk of the M data chunks that is missing from the subset of the M data chunks by at least one parity operation on the at least one of F parity block(s) and the subset of the M data chunks.

7. The apparatus of claim 6, wherein each channel of the non-volatile storage device comprises a plurality of dies, and each of the M+F data pieces is stored in a different die of a different channel.

8. The apparatus of claim 6, wherein the non-volatile storage device is one of: a NAND flash memory, a NOR flash memory, a magnetoresistive random Access Memory (MRAM), a resistive random access memory (RRAM), a phase change random access memory (PCRAM), and a Nano-RAM.

9. The apparatus of claim 6, wherein the at least one parity operation includes an XOR operation.

10. The apparatus of claim 6, wherein the interface is further configured to read a second batch of M data pieces in parallel from the M channels, the ECC engine is further configured to decode the second batch of M data pieces and determine that one data piece of the second batch of M data pieces fails to be decoded successfully, the interface is further configured to read a data piece from one of remaining F channels of the M+F channels, the ECC engine is further configured to decode the data piece from the one of remaining F channels of the M+F channels to recover a data chunk missing from a second batch of M data chunks.

11. A method for storing and retrieving data stored in a non-volatile storage device, comprising:
   transmitting M+F data pieces to M+F channels of the non-volatile storage device for each of the M+F data pieces to be stored in a different channel of the M+F channels, wherein the M+F data pieces include M error correction code (ECC) codewords generated from M data chunks and F ECC parity block(s) generated from the M ECC codewords, and M is an integer larger than one and F is an integer equal to or larger than one;
   reading M data pieces in parallel from M channels, wherein the M data pieces include a subset of the M ECC codewords and at least one of the F ECC parity block(s);
   obtaining at least one ECC codeword of the M ECC codewords that is missing from the subset of the M ECC codewords by at least one parity operation on the at least one of the F ECC parity block(s) and the subset of the M ECC codewords; and decoding the at least one ECC codeword obtained by the at least one parity operation and the subset of the M ECC codewords to obtain the M data chunks.

12. The method of claim 11, wherein each channel of the non-volatile storage device comprises a plurality of dies, and each of the M+F data pieces is stored in a different die of a different channel.

13. The method of claim 11, wherein the non-volatile storage device is one of: a NAND flash memory, a NOR flash memory, a magnetoresistive random Access Memory (MRAM), a resistive random access memory (RRAM), a phase change random access memory (PCRAM), and a Nano-RAM.

14. The method of claim 11, wherein the at least one parity operation includes an XOR operation.

15. The method of claim 11, further comprising:

reading a second batch of M data pieces in parallel from the M channels, wherein the second batch of M data pieces include a subset of a second set of M ECC codewords and at least one of a second set of F ECC parity block(s);

obtaining at least a second ECC codeword by at least a second parity operation on the at least one of the second set of F ECC parity block(s) and the subset of the second set of M ECC codewords;

decoding the at least second ECC codeword and the subset of the second set of M ECC codewords;

determining that one of the at least second ECC codeword and the subset of the second set of M ECC codewords fails to be decoded successfully;

reading a data piece from one of remaining F channels of the M+F channels to recover the codeword that fails to be decoded successfully.

16. An apparatus, comprising:

an interface coupled to a non-volatile storage device and configured to:

transmit M+F data pieces to M+F channels of the non-volatile storage device for each of the M+F data pieces to be stored in a different channel of the M+F channels, wherein the M+F data pieces include M error correction code (ECC) codewords generated from M data chunks and F ECC parity block(s) generated from the M ECC codewords, and M is an integer larger than one and F is an integer equal to or larger than one; and read M data pieces in parallel from M channels, wherein the M data pieces include a subset of the M ECC codewords and at least one of the F ECC parity block(s);

a parity generation circuit block coupled to the interface and configured to obtain at least one ECC codeword of the M ECC codewords that is missing from the subset of the M ECC codewords by at least one parity operation on the at least one of the F ECC parity block(s) and the subset of the M ECC codewords; and an error correction code (ECC) engine coupled to the interface and the parity generation circuit block, and configured to decode the at least one ECC codeword obtained by the at least one parity operation and the subset of the M ECC codewords to obtain the M data chunks.

17. The apparatus of claim 16, wherein each channel of the non-volatile storage device comprises a plurality of dies, and each of the M+F data pieces is stored in a different die of a different channel.

18. The apparatus of claim 16, wherein the non-volatile storage device is one of: a NAND flash memory, a NOR flash memory, a magnetoresistive random Access Memory (MRAM), a resistive random access memory (RRAM), a phase change random access memory (PCRAM), and a Nano-RAM.

19. The apparatus of claim 16, wherein the at least one parity operation includes an XOR operation.

20. The apparatus of claim 16, wherein the interface is further configured to read a second batch of M data pieces in parallel from the M channels, wherein the second batch of M data pieces include a subset of a second set of M ECC codewords and at least one of a second set of F ECC parity block(s), wherein the parity generation circuit block is further configured to obtain at least a second ECC codeword by at least a second parity operation on the at least one of the second set of F ECC parity block(s) and the subset of the second set of M ECC codewords, wherein the ECC engine is further configured to decode the at least second ECC codeword and the subset of the second set of M ECC codewords and determine that one of the at least second ECC codeword and the subset of the second set of M ECC codewords fails to be decoded successfully, and wherein the interface is further configured to read a data piece from one of remaining F channels of the M+F channels to recover the codeword that fails to be decoded successfully.

* * * * *